US011371540B2

(12) United States Patent
Schlack

(10) Patent No.: US 11,371,540 B2
(45) Date of Patent: Jun. 28, 2022

(54) LEVERED LATCH PLUNGER

(71) Applicant: SOUTHCO, INC, Concordville, PA (US)

(72) Inventor: Richard E. Schlack, Newark, DE (US)

(73) Assignee: Southco, Inc., Concordville, PA (US)

( * ) Notice: Subject to any disclaimer, the term of this patent is extended or adjusted under 35 U.S.C. 154(b) by 432 days.

(21) Appl. No.: 16/505,822

(22) Filed: Jul. 9, 2019

(65) Prior Publication Data
US 2020/0018335 A1 Jan. 16, 2020

Related U.S. Application Data

(60) Provisional application No. 62/807,410, filed on Feb. 19, 2019, provisional application No. 62/696,034, filed on Jul. 10, 2018.

(51) Int. Cl.
F16B 5/06 (2006.01)
H05K 1/14 (2006.01)

(52) U.S. Cl.
CPC ............ *F16B 5/0621* (2013.01); *H05K 1/144* (2013.01)

(58) Field of Classification Search
CPC ...... Y10T 403/595; F16B 5/02; F16B 5/0208; F16B 5/0621; F16B 5/0642; F16B 9/054; F16B 21/12; F16B 21/14; F16B 2/185; H05K 1/144
See application file for complete search history.

(56) References Cited

U.S. PATENT DOCUMENTS

| 595,290 A | 12/1897 | Dowman | |
|---|---|---|---|
| 761,568 A | 5/1904 | Wedler | |
| 2,166,208 A | 7/1939 | Dayton | |
| 2,726,060 A * | 12/1955 | Elsner | F16B 2/04 248/509 |
| 2,760,707 A | 8/1956 | Anderson | |
| 2,909,212 A | 10/1959 | Scherer | |

(Continued)

FOREIGN PATENT DOCUMENTS

| CN | 105952740 A * | 9/2016 |
|---|---|---|
| DE | 19601919 A1 | 7/1997 |

(Continued)

OTHER PUBLICATIONS

Southco Demonstration Panels; https://www.southco.com/en-us/28/28-56-5.

*Primary Examiner* — Matthew R McMahon
(74) *Attorney, Agent, or Firm* — RatnerPrestia

(57) ABSTRACT

A latch includes a ferrule defining a hollow interior region and a ferrule opening that opens into the hollow interior region. A washer is positioned adjacent an end of the ferrule. The washer defines a washer opening. A stud has an elongated body extending along a stud axis, and the stud is positioned to extend through the ferrule opening and keyed to the washer opening such that the stud rotates about the stud axis along with the washer. A lever is pivotably connected to the stud. Rotation of the lever about the pivot axis causes translation of the stud along the stud axis with respect to the ferrule between a latched position, in which an end of the stud protrudes beyond a connection end of the ferrule, and an unlatched position, in which the end of the stud is contained within the interior region defined by the ferrule.

12 Claims, 11 Drawing Sheets

(56) References Cited

U.S. PATENT DOCUMENTS

| | | | |
|---|---|---|---|
| 3,402,958 A * | 9/1968 | Barry | E05C 3/042 |
| | | | 292/62 |
| 3,406,995 A | 10/1968 | McCarthy | |
| 5,165,720 A * | 11/1992 | Hoblingre | B62D 1/184 |
| | | | 280/775 |
| 5,205,101 A | 4/1993 | Swan et al. | |
| 5,234,236 A * | 8/1993 | Gromotka | E05B 63/0056 |
| | | | 292/194 |
| 5,492,350 A * | 2/1996 | Pan | B62K 15/006 |
| | | | 280/278 |
| 5,681,067 A | 10/1997 | MacIntyre | |
| 5,865,560 A | 2/1999 | Mercat et al. | |
| 5,887,927 A | 3/1999 | Kurek et al. | |
| 6,004,064 A * | 12/1999 | Franz | B62K 25/02 |
| | | | 301/124.2 |
| 6,260,931 B1 | 7/2001 | Stewart | |
| 6,371,313 B1 * | 4/2002 | Walter | A47F 5/137 |
| | | | 211/123 |
| 6,505,849 B1 | 1/2003 | Ebey | |
| 6,659,513 B1 * | 12/2003 | Ramsauer | E05B 17/0025 |
| | | | 292/64 |
| 7,364,181 B2 | 4/2008 | Patterson | |
| 7,491,007 B2 * | 2/2009 | Burrows | F41H 5/20 |
| | | | 403/322.1 |
| 7,559,716 B2 * | 7/2009 | Ganter | B25B 5/08 |
| | | | 269/229 |
| 7,673,947 B2 * | 3/2010 | Chang | B62K 25/02 |
| | | | 301/124.2 |
| 8,047,475 B2 * | 11/2011 | Fukumoto | F16B 21/086 |
| | | | 248/73 |
| 8,196,789 B2 * | 6/2012 | Kraeuter | B60R 9/048 |
| | | | 224/315 |
| 8,234,725 B2 * | 8/2012 | Roth | A47K 17/022 |
| | | | 4/577.1 |
| 8,573,878 B2 | 11/2013 | Chang | |
| 9,046,118 B2 * | 6/2015 | Schmitz | F16B 2/185 |
| 9,360,037 B2 | 6/2016 | Wang | |
| 9,441,653 B2 | 9/2016 | Wang | |
| 9,540,068 B2 * | 1/2017 | Coombs | B62K 25/02 |
| 2002/0111094 A1 * | 8/2002 | Jensen | B63B 32/35 |
| | | | 441/75 |
| 2006/0273503 A1 | 12/2006 | Ganter | |
| 2011/0203781 A1 | 8/2011 | Ellingwood et al. | |
| 2012/0034028 A1 | 2/2012 | Schmitz | |
| 2013/0071177 A1 | 3/2013 | Wang | |
| 2013/0183086 A1 * | 7/2013 | Wang | F16B 5/0642 |
| | | | 403/327 |
| 2015/0010346 A1 | 1/2015 | Wang | |
| 2017/0074304 A1 | 3/2017 | Bowers et al. | |

FOREIGN PATENT DOCUMENTS

| | | | | |
|---|---|---|---|---|
| DE | 102017108414 A1 * | 9/2018 | | H01R 4/40 |
| TW | 422096 U | 2/2012 | | |

\* cited by examiner

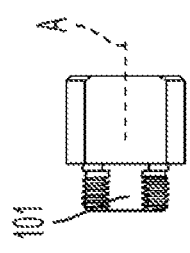
FIG. 13D
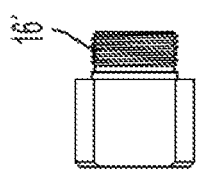
FIG. 13C
FIG. 13B
FIG. 13A
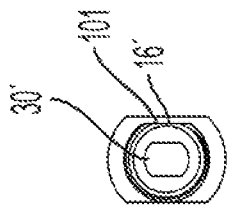
FIG. 13G
FIG. 13F
FIG. 13E

US 11,371,540 B2

LEVERED LATCH PLUNGER

CROSS REFERENCE TO RELATED APPLICATION

This application is a U.S. Non-Provisional patent application claiming priority to U.S. Provisional Patent Application Ser. No. 62/696,034, filed Jul. 10, 2018 and U.S. Provisional Patent Application Ser. No. 62/807,410, filed Feb. 19, 2019, the contents of each of which are incorporated herein by reference in their entirety for all purposes.

FIELD OF THE INVENTION

The present invention relates to the field of latches.

BACKGROUND OF THE INVENTION

A latch plunger is adapted to be fixedly mounted to one plate (e.g., a first circuit board), and includes a moveable plunger that is adapted to be selectively positioned within an aperture of a mating plate (e.g., a second circuit board) for aligning the two plates together. Although latch plungers are known in the art, improvements to latch plungers are continually sought in the interests of at least one of usability, ergonomics, features, and cost, for example.

SUMMARY OF THE INVENTION

According to one aspect of the invention, a latch includes a ferrule having a body defining a connection end that is configured to be connected to a panel and an opposite end opposite the connection end. The ferrule defines a hollow interior region and a ferrule opening that opens into the hollow interior region. A washer is positioned adjacent the opposite end of the ferrule. The washer defines a washer opening. A stud has an elongated body extending along a stud axis, and the stud is positioned to extend through the ferrule opening and keyed to the washer opening such that the stud rotates about the stud axis along with the washer. A lever is pivotably connected to the stud about a pivot axis that is orthogonal to the stud axis, the lever being positioned such that the washer is interposed between the lever and the opposite end of the ferrule. Rotation of the lever about the pivot axis causes translation of the stud along the stud axis with respect to the ferrule between a latched position, in which an end of the stud protrudes beyond the connection end of the ferrule, and an unlatched position, in which the end of the stud is contained within the interior region defined by the ferrule.

According to another aspect of the invention, a latch comprises a ferrule having a body defining a connection end that is configured to be connected to a panel and an opposite end opposite the connection end, the ferrule defining a hollow interior region and a ferrule opening that opens into the hollow interior region; a stud having an elongated body extending along a stud axis, the stud being positioned to extend through the ferrule opening; and a lever that is pivotably connected to the stud about a pivot axis that is orthogonal to the stud axis, wherein rotation of the lever about the pivot axis causes translation of the stud along the stud axis with respect to the ferrule between a latched position, in which an end of the stud protrudes beyond the connection end of the ferrule, and an unlatched position, in which the end of the stud is contained within the interior region defined by the ferrule. The lever is configured to rotate about the stud axis for adjusting a radial position of the lever about the ferrule.

According to yet another aspect of the invention, a latch comprises a ferrule having a body defining a connection end that is configured to be connected to a panel an opposite end opposite the connection end, the ferrule defining a hollow interior region and a ferrule opening that opens into the hollow interior region; a stud having an elongated body extending along a stud axis, the stud being positioned to extend through the ferrule opening; and a lever pivotably connected to the stud about a pivot axis that is orthogonal to the stud axis, wherein rotation of the lever about the pivot axis causes translation of the stud along the stud axis with respect to the ferrule between a latched position, in which an end of the stud protrudes beyond the connection end of the ferrule, and an unlatched position, in which the end of the stud is contained within the interior region defined by the ferrule. The lever includes a pointed tip that is positioned to engage with a detent defined on the latch, the pointed tip of the lever and the detent defined on the latch being configured for retaining the lever in the unlatched position.

According to still another aspect of the invention, a latch comprises a ferrule having a body defining a connection end that is configured to be non-rotatably connected to a panel and an opposite end opposite the connection end, the ferrule defining a hollow interior region and a ferrule opening that opens into the hollow interior region; a washer positioned adjacent the opposite end of the ferrule, the washer defining a washer opening; a stud having an elongated body extending along a stud axis, the stud being positioned to extend through the ferrule opening and the washer opening, wherein the stud is non-rotatably connected to both the ferrule opening and the washer opening; and a lever pivotably connected to the stud about a pivot axis that is orthogonal to the stud axis, the lever being positioned such that the washer is interposed between the lever and the opposite end of the ferrule. Rotation of the lever about the pivot axis causes translation of the stud along the stud axis with respect to the ferrule between a latched position, in which an end of the stud protrudes beyond the connection end of the ferrule, and an unlatched position, in which the end of the stud is contained within the interior region defined by the ferrule.

According to another aspect of the invention, a latch assembly comprises a component; and a plurality of latches indirectly or directly coupled to the component, wherein each latch includes:
 (i) a ferrule having a body defining a connection end that is configured to be connected to the component and an opposite end opposite the connection end, the ferrule defining a hollow interior region and a ferrule opening that opens into the hollow interior region;
 (ii) a stud having an elongated body extending along a stud axis, the stud being positioned to extend through the ferrule opening; and
 (iii) a lever that is pivotably connected to the stud about a pivot axis that is orthogonal to the stud axis, wherein rotation of the lever about the pivot axis causes translation of the stud along the stud axis with respect to the ferrule between a latched position, in which an end of the stud protrudes beyond the connection end of the ferrule, and an unlatched position, in which the end of the stud is contained within the interior region defined by the ferrule. When the levers of the latches are each positioned in the latched position, the levers are aligned with each other in the same directional orientation, and when the levers are each positioned in the unlatched position, the levers are also aligned with each other in the same directional orientation.

According to yet another aspect of the invention, a latch comprises a ferrule having a body defining a connection end that is configured to be non-rotatably connected to a panel and an opposite end opposite the connection end, the ferrule defining a hollow interior region and a ferrule opening that opens into the hollow interior region; a stud having an elongated body extending along a stud axis, the stud being positioned to extend through the ferrule opening; and a lever pivotably connected to the stud about a pivot axis that is orthogonal to the stud axis. Rotation of the lever about the pivot axis causes translation of the stud along the stud axis with respect to the ferrule between a latched position, in which an end of the stud protrudes beyond the connection end of the ferrule, and an unlatched position, in which the end of the stud is contained within the interior region defined by the ferrule. The stud is keyed to the ferrule to prevent the stud and the lever from rotating about the stud axis.

BRIEF DESCRIPTION OF THE DRAWINGS

The above and other aspects and features of the present invention will become more apparent to those of ordinary skill in the art by describing in detail exemplary embodiments thereof with reference to the attached drawings.

FIGS. 13A-13G are isometric, top plan, right side, left side, front elevation, rear elevation and bottom plan views, respectively, of the ferrule of FIG. 10.

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention.

Figure 1:
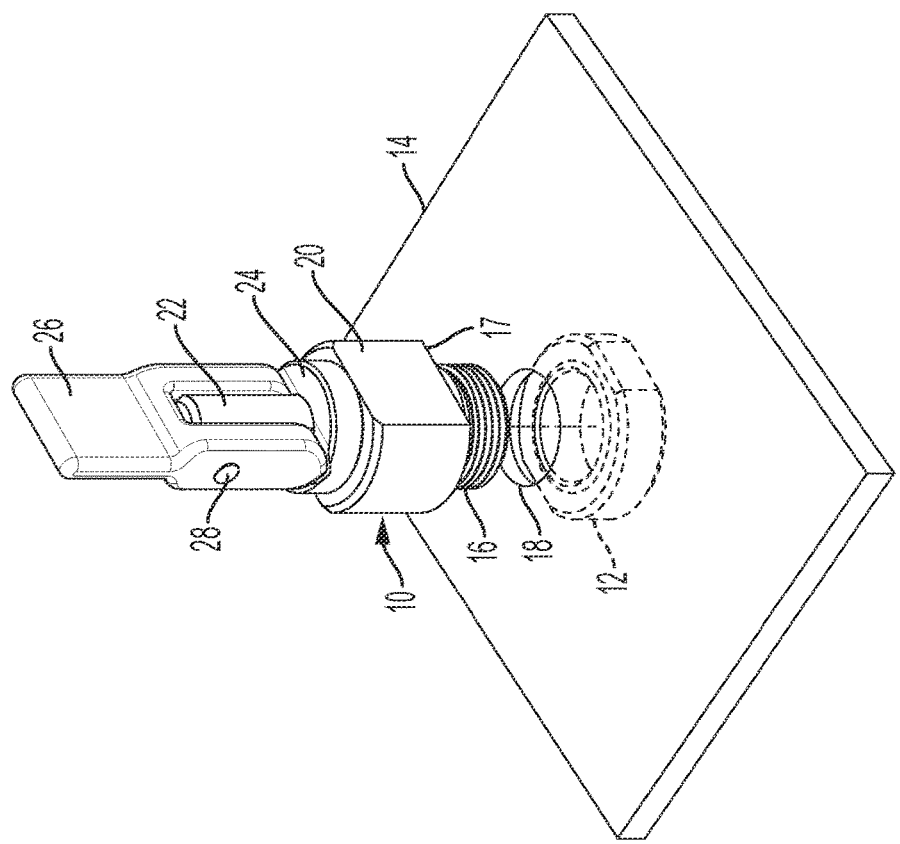
FIG. 1 is a partially exploded view of a latch, a nut and a panel.
Figure 3D:
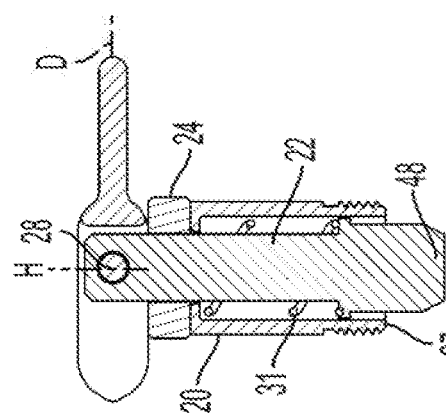
FIG. 3D is a cross-sectional view of the latch of FIG. 3B taken along the lines 3D-3D.

FIG. 1 is a partially exploded view of a latch 10, a nut 12 and a panel 14. The panel 14, which may also be referred to herein as a component, includes an opening 18 through which a threaded portion 16 of the latch 10 is inserted until the shoulder 17 of the latch 10 is seated onto the top surface of the panel 14. The threaded portion 16 extends beneath the panel 14. The nut 12 is threaded onto the threaded portion 16 of the latch 10 for fastening the latch 10 to the panel 14. One exemplary application of the latch 10 is shown in FIG. 1, however, other applications are envisioned.

Figure 2:
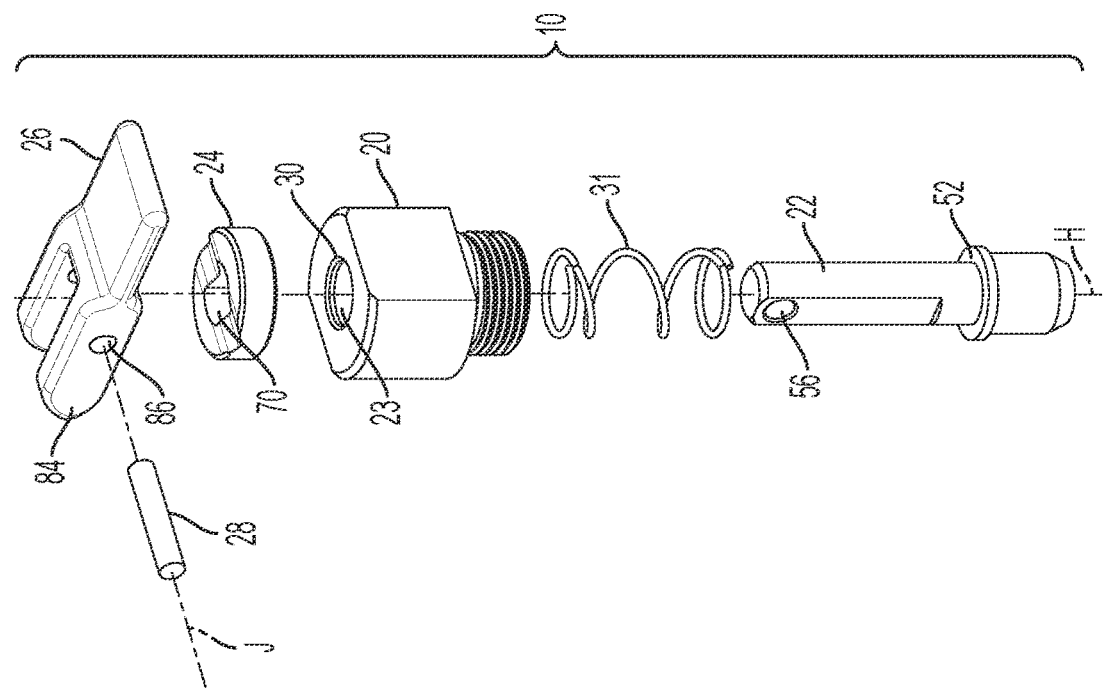
FIG. 2 is an exploded view of the latch of FIG. 1.

FIG. 2 is an exploded view of the latch 10 of FIG. 1. The latch 10 may be referred to in the art as a quick-release latch or a quick access fastener, for example. The latch 10 generally includes a ferrule 20 that is configured to be installed on the panel 14, a stud 22 that is movably positioned within an opening disposed in the ferrule, a washer 24 that is positioned atop the ferrule 20 and is keyed to the stud 22, a lever 26 that is connected to the stud 22 by a pin 28 and is pivotably mounted atop the washer 24, and a compression spring 31 for biasing the stud 22 in a downward direction toward a latched position.

Referring now to each of the individual components of the latch 10, FIGS. 6A-6D depict the ferrule 20 of the latch 10. The ferrule 20 includes a hollow partially cylindrical body 21 extending along a longitudinal axis A and defining a hollow interior 23. The body 21 includes a bottom end 27 (also referred to herein as a connection end), a top end 33 and a side wall 38 extending between the bottom and top ends.

The threaded portion 16 is disposed on the exterior side wall 38 at the bottom end 27. A wall 29 extends across the top end 33 and includes an opening 30 that opens to the hollow interior 23 of the ferrule 20. An interior shoulder 32 is formed on the interior of the body 21 at the intersection of the side wall 38 and the wall 29. The shoulder 32 is formed about the opening 30.

An upper portion 34 of the body 21 extends above the threaded portion 16. The side wall 38 of the upper portion 34 has a cylindrical shape that is interrupted by two flat portions 36 that are disposed in radially opposite positions about the axis A. Generally, the side wall 38 of the upper portion 34 may have a non-circular shape. The shoulder 17 is formed at the intersection of the threaded portion 16 and the upper portion 34.

The bottom end 27 of the ferrule 20 may vary from that which is shown and described. For example, in lieu of the threaded portion 16, the bottom end 27 may have a barb-style connector, a self-clinching style connector, or a flare-in style end.

FIGS. 7A-7D depict the stud 22 of the latch 10. The stud 22 includes a solid and partially cylindrical elongated body 40 extending along a longitudinal axis B. The body 40 includes a bottom end 42, a top end 44 and a side wall 46 extending between the bottom and top ends. The bottom portion 48 (also referred to herein as the plunger) of the body 40 has a large diameter as compared with the remainder of the body 40. A chamfer 49 is defined at the bottom end 42 of the bottom portion 48. The bottom portion 48 may vary from that which is shown and described. For example, the bottom portion 48 may be shaped to accommodate various receptacles.

A flange 50 extends in a radial direction from the top side of the bottom portion 48, such that a shoulder 52 is defined on the top side of the flange 50. A post 54 extends in a vertical direction along axis B from the bottom portion 48. A transverse opening 56 is defined through the top end of the post 54. The transverse opening 56 extends orthogonal to the axis B. The transverse opening 56 is sized for receiving the pin 28 in a press-fit manner. The exterior surface of the post 54 has a cylindrical shape that is interrupted by two flat portions 58 that are disposed in radially opposite positions about the axis B. Each flat portion 58 extends from the top end 44 to the middle portion of the post 54. Generally, the exterior surface of the post 54 may have a non-circular shape. The opening 56 is defined through the flat portions 58.

FIGS. 8A-8D depict the washer 24 of the latch 10. The washer 24 includes a solid cylindrical body 60 extending along a longitudinal axis C. The body 60 includes a bottom end 62, a top end 64 and a revolved side wall 66 extending between the bottom and top ends. A depression, channel, recess or detent 68 (detent 68, hereinafter) is formed on the top end 64 of the body 60 and extends across the radial extent of the body 60. The detent 68 is a rounded concave surface, which may be characterized as cylindrical, however, the geometry of the detent 68 can vary. The thickness 't' of the body 60 at the detent 68 is less than the maximum thickness of the body 60. The top and bottom edges of the body 60 are chamfered. A central opening 70 is defined through the thickness 't' of the body 60. The opening 70 has a cylindrical perimeter that is interrupted by two flat portions 72 that are disposed in radially opposite positions about the axis C. The detent 68 intersects both flat portions 72. Stated differently, the flat portions 72 extend orthogonally to a longitudinal axis defined by the detent 68.

FIGS. 9A-9D depict the lever 26 of the latch 10. The lever 26 includes a solid cylindrical body 80 extending along a longitudinal axis D. The body 80 includes a rectangular shaped handle portion 82 at one end that extends along axis D, and two tines 84 that bifurcate from the handle portion 82 and extend further along axis D. An opening 86 is formed in each tine 84. Each opening 86 extends in a direction that is substantially orthogonal to the axis D. The openings 86 are aligned with each other and are each sized for receiving the pin 28 in a press-fit manner. A thickness 't' of each tine 84 is greater than that of the handle portion 82. An opening 88 is formed between the flat interior facing surfaces of the two tines 84.

The free end 90 of each tine 84 is rounded and terminates at a pointed tip 92 at the distal-most end. Although the pointed tip 92 of the embodiment illustrated in FIGS. 9A to 9D includes a small radius at the distal-most end of each tine 84, the pointed tip 92 is optionally provided with an edge surface. Either way, the pointed tip 92 helps to align the lever 26 in the unlatched position, such as that shown in FIG. 5A, by engaging within a recess such as the detent 68 and abutting against an interior of the detent 68. The detent 68 helps provide more positive holding of the lever 26 in the unlatched position. In the illustrated embodiment, the convex contour of the pointed tip 92 of each tine 84 can be matched to the concave contour of the detent 68.

Figure 9A:
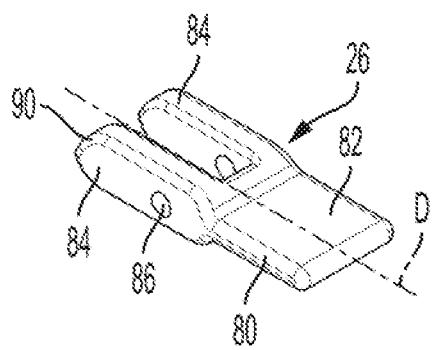
FIG. 9A is an isometric view of a lever of the latch of FIG. 1.
Figure 9B:
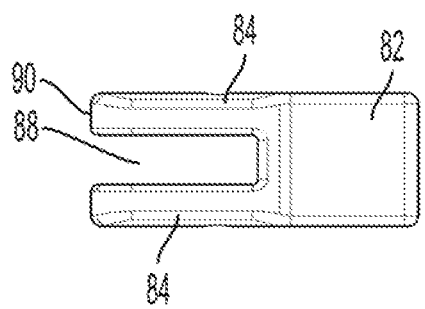
FIG. 9B is a front elevation view of the lever of FIG. 9A.
Figure 9C:
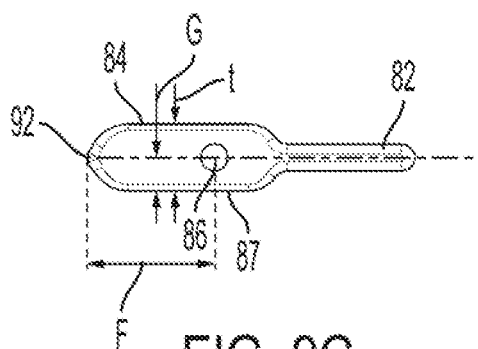
FIG. 9C is a bottom plan view of the lever of FIG. 9A.
Figure 9D:
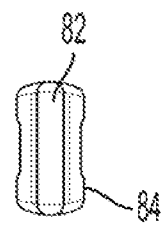
FIG. 9D is a right side elevation view of the lever of FIG. 9A.

As shown in FIG. 9C, the lengthwise distance F between the center of the opening 86 and the tip 92 is pre-determined. The widthwise distance G between the center of the opening 86 and the flattened side 87 of the tines 84 is also pre-determined. The lengthwise distance F is greater than the widthwise distance G, the significance of which will be described later.

Referring now to FIG. 2, according to one method of assembling the latch 10, the compression spring 31 is positioned over the top end 44 of the stud 22 until the bottom end of the spring 31 bears on the shoulder 52 of the stud 22. The top end 44 of the stud 22 is then positioned through the opening 30 of the ferrule 20. The top end 44 of the stud 22 is then positioned through the opening 70 of the washer 24. The top end 44 of the stud 22 is then positioned between the tines 84 such that the opening 56 in the stud 22 is coaxial with the openings 86 in the tines 84. The post 54 of the stud 22 is keyed to the opening 70 of the washer 24 by virtue of their complimentary geometries, such that the stud 22 is non-rotatably connected to the washer 24 (i.e., the stud 22 rotates along with the washer 24 about axis H). The top end of the spring 31 comes to rest on the interior shoulder 32 of the ferrule 20. The pin 28 is then inserted (and, optionally press-fit) through the openings 86 in the tines 84 and the opening 56 in the stud 22. The lever 26 is rotatable about axis J, which is defined by the pin 28. The lever is also rotatable about axis H, which is orthogonal to axis J, along with the stud 22 and the washer 24. The post 54 of the stud 22 is also keyed to the opening 88 of the lever 26 by virtue of their complimentary geometries, such that the stud 22 is non-rotatably connected to the lever 26 (i.e., the stud 22 rotates along with the lever 26 about axis H). The components of the latch 10 are thereby captivated together.

Referring now to FIGS. 3A-5D, according to one method of operating the latch 10, in the fully latched position of the latch 10 shown in FIGS. 3A-3D, the bottom end 48 of the stud 22 protrudes beyond the bottom end 27 of the ferrule 20. Although not shown, the bottom end 48 of the stud 22 may be positioned in an opening of a mating board, thereby aligning the board to which the latch 10 is connected with the mating board. The axis D of the lever 26 is oriented orthogonally with respect to the axis B of the stud 22. The tip 92 of the lever 26 is separated from the detent 68.

Figure 3C:
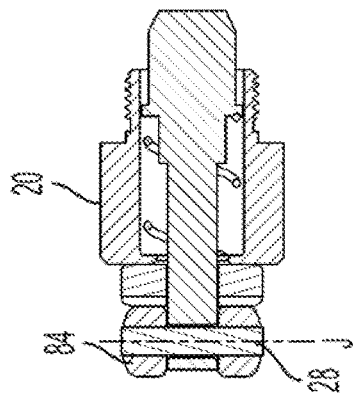
FIG. 3C is a cross-sectional view of the latch of FIG. 3B taken along the lines 3C-3C.
Figure 3B:
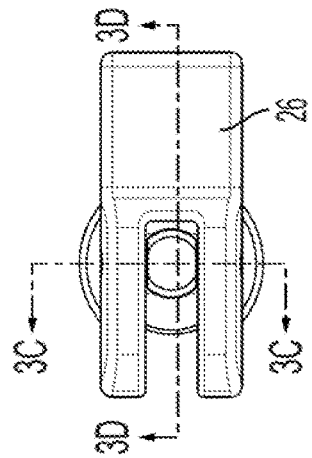
FIG. 3B is a top plan view of the latch of FIG. 3A.
Figure 3A:
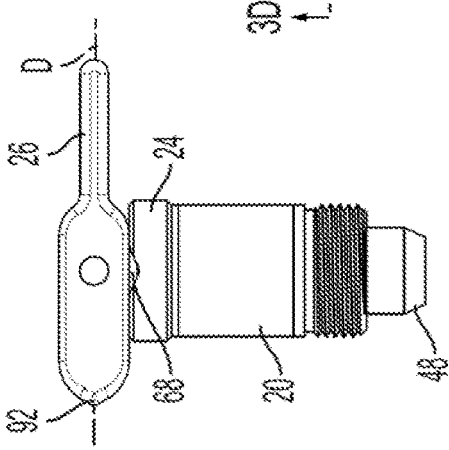
FIG. 3A is a side elevation view of the latch of FIG. 1 shown in a fully latched position.
Figure 4A:
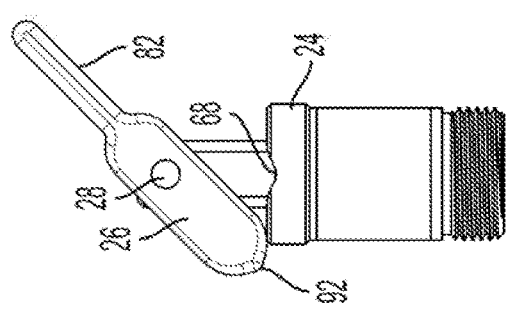
FIG. 4A is a side elevation view of the latch of FIG. 1 shown mid-way between fully latched and fully unlatched positions.

Although the lever 26 is shown in FIG. 3A with the tip 92 pointing to the left, it should be understood that the lever 26 could also be oriented with the tip 92 pointing to the right in the fully latched position of the latch 10. The lever 26 is capable of pivoting about axis J by 180 degrees.

Figure 4D:
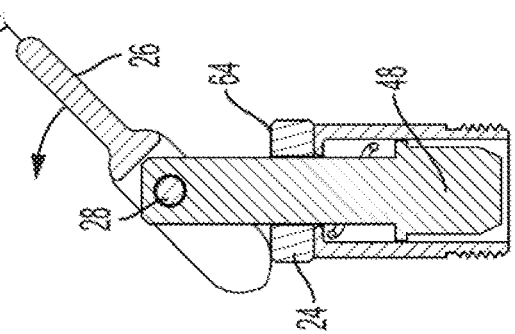
FIG. 4D is a cross-sectional view of the latch of FIG. 4B taken along the lines 4D-4D.
Figure 4C:
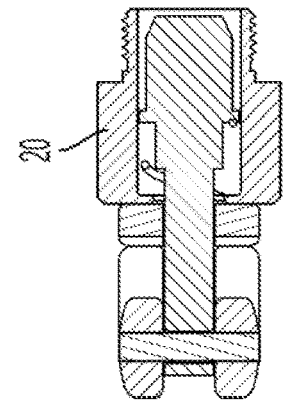
FIG. 4C is a cross-sectional view of the latch of FIG. 4B taken along the lines 4C-4C.
Figure 4B:
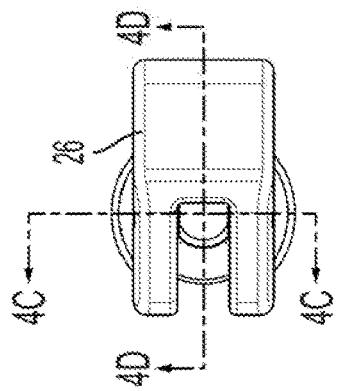
FIG. 4B is a top plan view of the latch of FIG. 4A.

Turning now to FIGS. 4A-4D, a user rotates the handle portion 82 about axis J in the counter clockwise direction (as viewed in FIG. 4D). Rotating the handle portion 82 in the counter clockwise direction causes the lever 26 to rotate about the pin 28, which causes the side of the lever 26 to slide along the top end 64 of the washer 24, which causes the stud 22 to translate upwardly against the bias of the spring 31, thereby compressing the spring 31. It should be understood that the handle portion 82 could be rotated from the fully latched in the clockwise direction if the lever 26 were initially lying 180 degrees from the position shown in FIG. 3A.

Figure 5D:
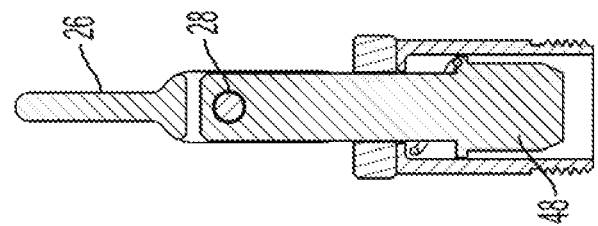
FIG. 5D is a cross-sectional view of the latch of FIG. 5B taken along the lines 5D-5D.
Figure 5C:
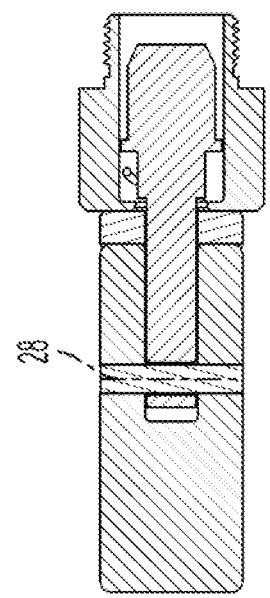
FIG. 5C is a cross-sectional view of the latch of FIG. 5B taken along the lines 5C-5C.
Figure 5B:
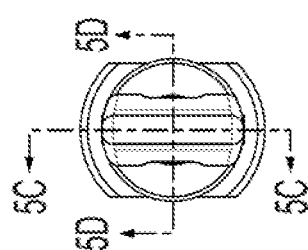
FIG. 5B is a top plan view of the latch of FIG. 5A.
Figure 5A:
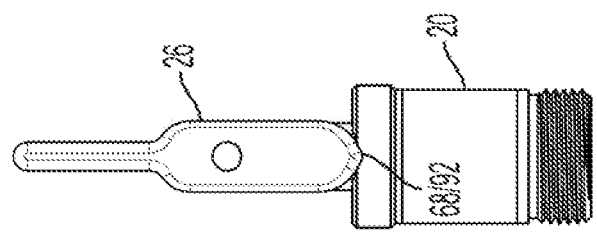
FIG. 5A is a side elevation view of the latch of FIG. 1 shown in a fully unlatched position.
Figure 6A:
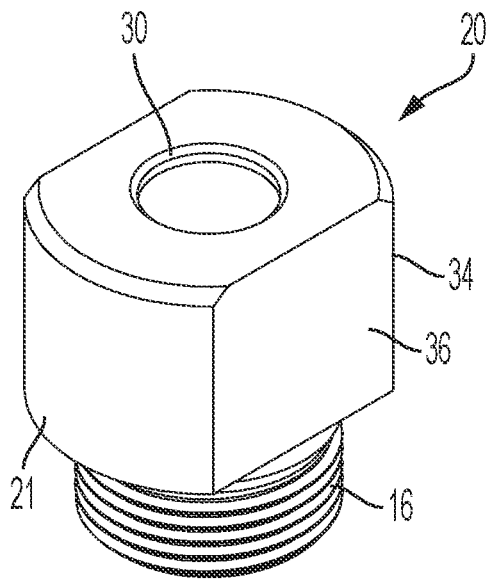
FIG. 6A is an isometric view of a ferrule of the latch of FIG. 1.
Figure 6B:
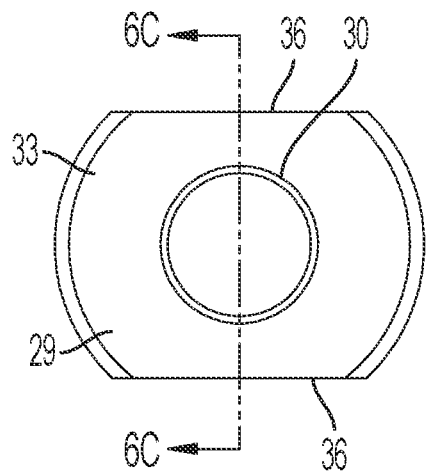
FIG. 6B is a top plan view of the ferrule of FIG. 6A.
Figure 6C:
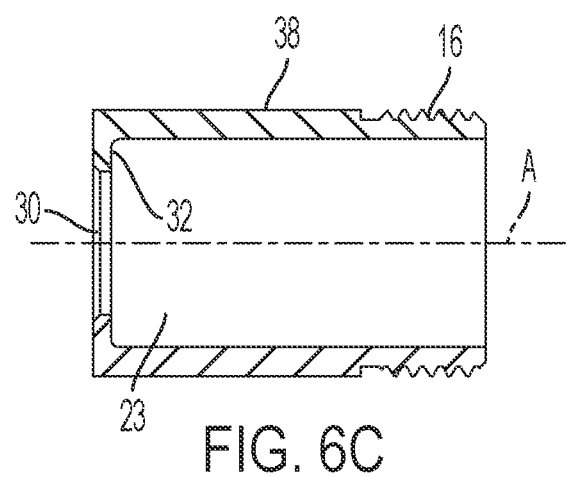
FIG. 6C is a cross-sectional view of the ferrule of FIG. 6B taken along the lines 6C-6C.
Figure 6D:
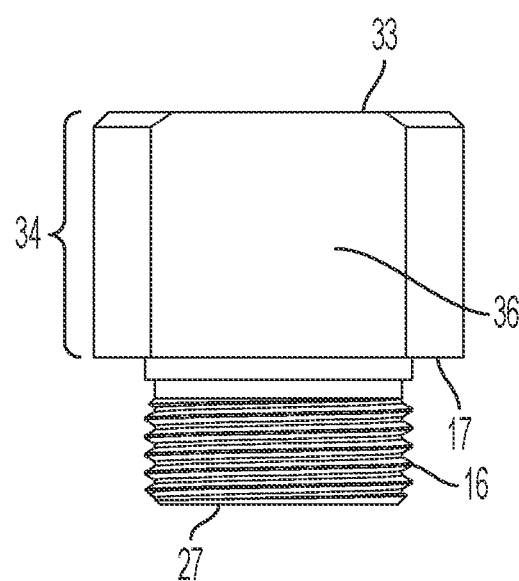
FIG. 6D is a side elevation view of the ferrule of FIG. 6A.
Figure 7A:
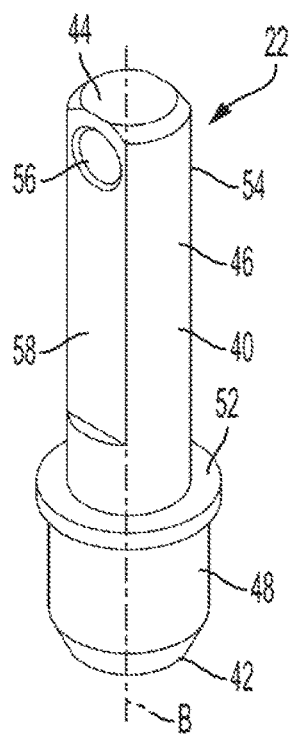
FIG. 7A is an isometric view of a stud of the latch of FIG. 1.
Figure 7B:
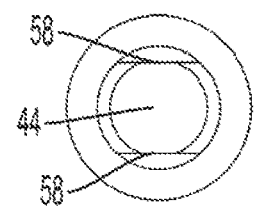
FIG. 7B is a top plan view of the stud of FIG. 7A.
Figure 7C:
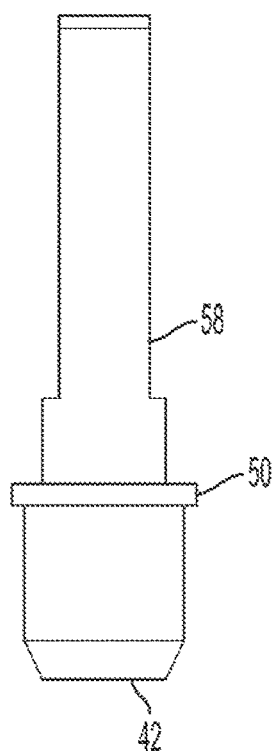
FIG. 7C is a right side elevation view of the stud of FIG. 7A.
Figure 7D:
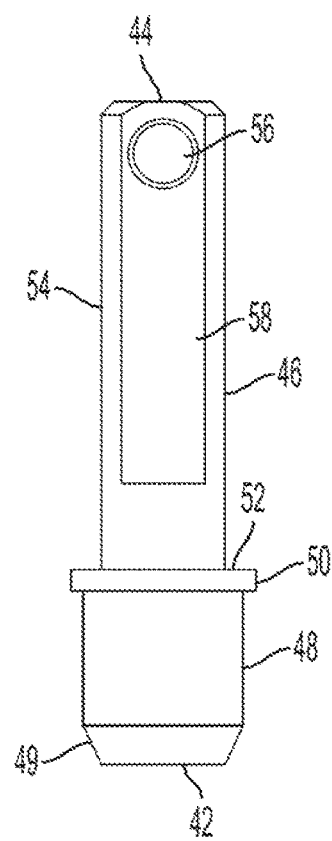
FIG. 7D is a front side elevation view of the stud of FIG. 7A.
Figure 8A:
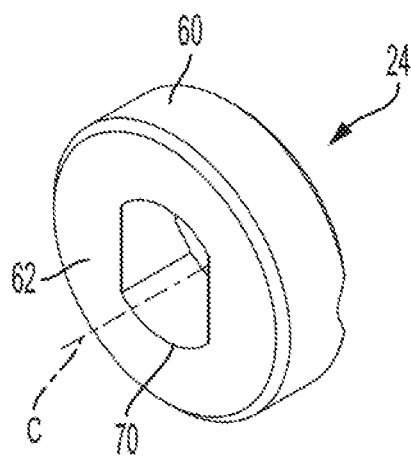
FIG. 8A is a rear isometric view of a washer of the latch of FIG. 1.
Figure 8B:
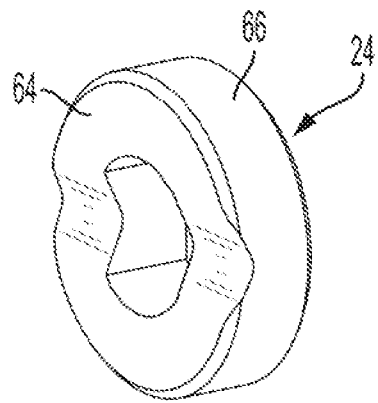
FIG. 8B is a front isometric view of the washer of FIG. 8A.
Figure 8C:
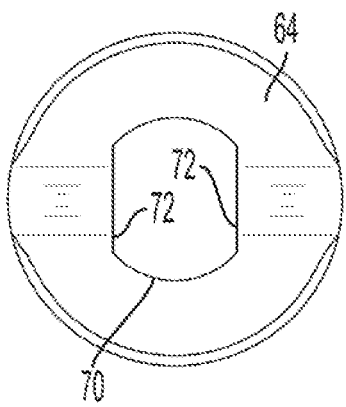
FIG. 8C is a side elevation view of the washer of FIG. 8A.
Figure 8D:
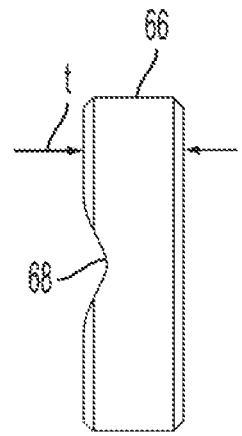
FIG. 8D is a front elevation view of the washer of FIG. 8A.

Turning now to FIGS. 5A-5D, continued rotation of the handle portion 82 in the counter clockwise direction causes the tip 92 to slide and roll along the top end 64 of the washer 24 until the tip 92 enters the detent 68, as shown in FIG. 5A. At that moment, the latch 10 is maintained in the fully-unlatched position in which the bottom end 48 of the stud 22 is completely contained within the hollow interior 23 of the ferrule 20. Accordingly, and although not shown, the bottom end 48 of the stud 22 is withdrawn from the opening in the mating board, which was described above. As noted above, the free end 90 of each tine 84 is rounded, as opposed to being flat, which makes it easier for the tip 92 to slide along the top end 64 of the washer 24.

The force of the spring 31, along with the complimentary geometries of the tip 92 and detent 68, retain the lever 26 in the vertical position until the lever 26 is moved again by the user. It is noted that the detent 68 of the washer 24 could be customized to tailor the force required to unseat the tip 92 from the detent 68. Specifically, providing a separate washer component according to this embodiment allows for customization of the detent action-force, e.g., the force needed to release the lever from the detent, the force needed to bias the lever into or out of the detent until the lever is tilted to a predetermined angle, etc. Also, by providing a separate washer component, a fixed version of the design can be provided in which the lever is not permitted to rotate about the axis of the plunger or in which the amount of such lever rotation is limited.

Referring back to FIG. 9C, the stud 22 is capable of translating while the lever 26 is rotated because the lengthwise distance F of the lever 26 is greater than the widthwise distance G of the lever 26.

To return the latch 10 to the fully latched position of FIGS. 3A-3D, the user rotates the handle portion 82 of the lever 26 about the pin 28 in either the clockwise or counter clockwise direction, thereby withdrawing the tip 92 from the detent 68, which causes the spring 31 to urge the stud 22 in the downward direction. The handle portion 82 of the lever 26 is rotated until the flat side 87 of the lever 26 rests on the top end 64 of the washer 24, and the bottom end 48 of the stud 22 protrudes beyond the bottom end 27 of the ferrule 20.

The latch 10 is particularly advantageous in that the latch merely requires a single, simple throwing motion for moving the latch 10 between the latched and unlatched states. Alternatively, plungers can be designed in such a way as to require a lift motion, followed by a twist motion to position the stud to stay in the open position. In contrast to plungers having such lift and twist motions, the single throwing motion of latch 10 takes less time when moving the latch 10 between the latched and unlatched states. This time reduction is especially advantageous in applications, such as large computer server farms, in which many latches must be manipulated.

The latch 10 is also advantageous in that the lever 26 is capable of being moved (i.e., thrown) in two different directions for shifting the latch 10 from the unlatched state to the latched state.

It should be understood that in the unlatched state of the latch 10, the axes A, B, C and D are aligned. In the latched state of the latch 10, the axes A, B and C are aligned, whereas the axis D is orthogonal to axes A, B and C. It is noted that the axis H of the latch 10 is always aligned with axes A, B and C of the components of the latch 10.

It is possible to rotate or swivel the lever 26 about axis H in the fully latched, fully unlatched, and partially latched/unlatched states of the latch 10. Rotating the lever 26 causes rotation of the washer 24 and the stud 22. The ferrule 20, which is mounted to a panel (not shown) does not rotate along with the lever 26, the washer 24 and the stud 22. Swiveling of the lever 26 about axis H is beneficial in the event that insufficient vertical and/or horizontal clearance for rotating the lever 26 about the pin 28 exists at one rotational position of the lever 26 about axis H. Additionally, this swivel feature also makes it possible to orient the latch 10 in any direction when it is installed. In other words, no orientation is required upon installation and the rotational orientation of the lever 26 can be easily adjusted after installation. As an alternative to the swiveling design, the latch could be designed so that the lever 26, the washer 24 and the stud 22 are prevented from rotating with respect to the ferrule 20.

Figure 10:
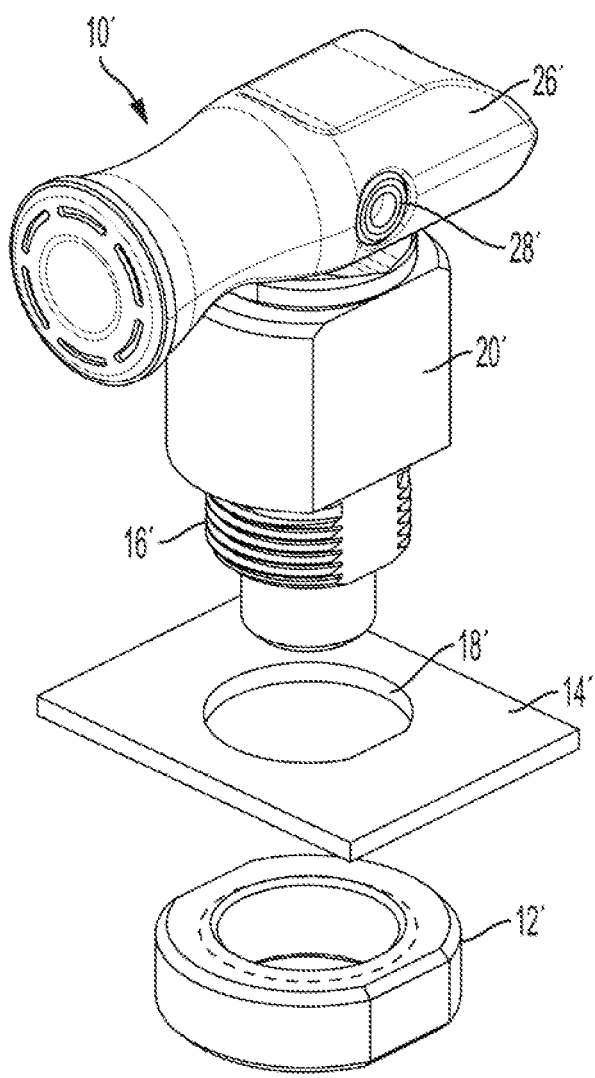
FIG. 10 is a partially exploded view of a latch, a nut and a panel, according to another exemplary embodiment of the invention.
Figure 12:
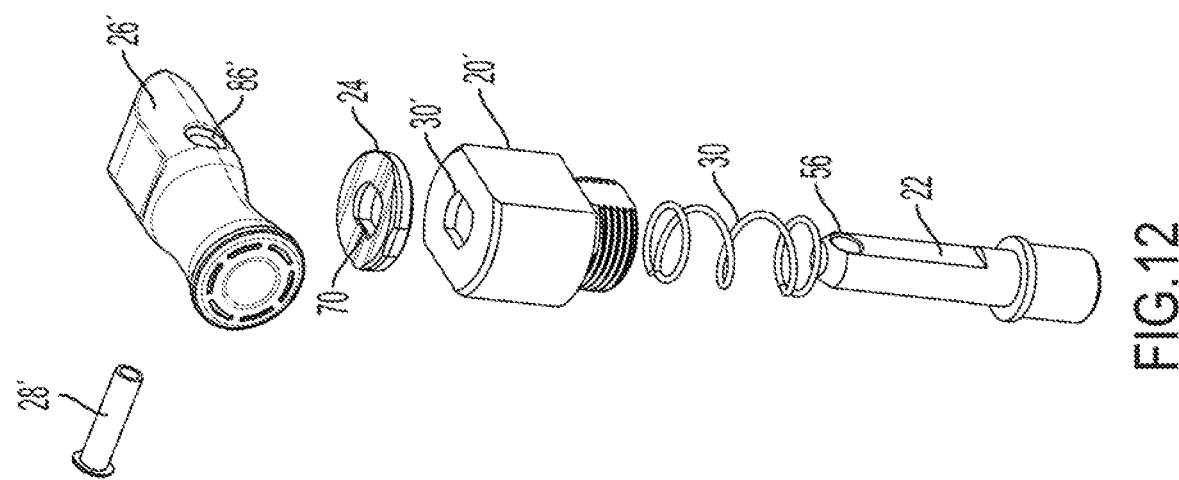
FIG. 12 is an exploded view of the latch of FIG. 10.
Figure 11B:
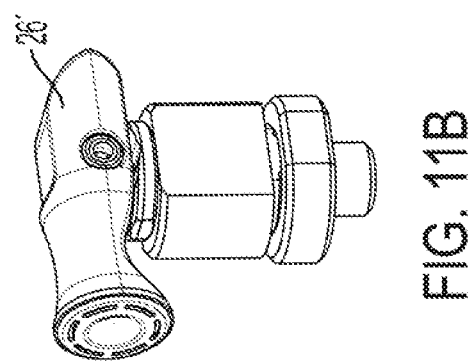
FIG. 11B is an isometric view of the latch of FIG. 10 shown in a fully latched position.
Figure 11A:
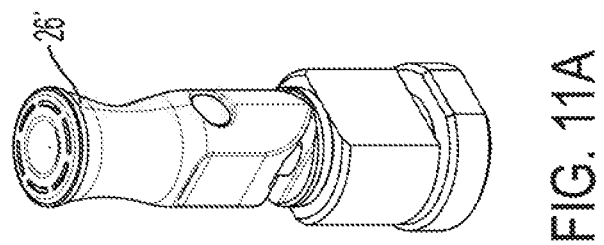
FIG. 11A is an isometric view of the latch of FIG. 10 shown in a fully unlatched position.

FIGS. 10-12 depict a latch 10' according to another exemplary embodiment of the invention, and FIGS. 13A-13G depict the ferrule 20' of the latch 10'. The structure, operation and function of the latch 10' are substantially similar to that of the latch 10, and only the primary differences will be described hereinafter. Similar features are represented with a prime designation.

The shape of the lever 26' varies from that of lever 26. The lever 26' has a shape that is configured to be manipulated by a user, and moved between the latched and unlatched positions. Certain features of the lever 26' are selected for ornamental design and are not dictated by practical function. Accordingly, design elements of the lever 26' can be varied and selected while maintaining functionality, such that a variety of ornamental configurations are available with substantially the same function or performance. For example, the contours, colors and configurations of the lever 26' can vary to provide a different ornamental appearance while maintaining substantially the same functionality. The ornamental design of the lever is protected separately in U.S. Design patent application Ser. No. 29/664,561.

The lever 26' is rotatably mounted to the stud 22 by a rivet 28' that passes through the opening 86' of the lever 26' and the opening 56 of the stud 22. In the process of assembling the latch 10', one end of the rivet 28' is riveted to the lever 26'. The rivet 28' may be frictionally engaged with the surfaces of the openings 56 and 86'. Alternatively, the rivet 28' may be loosely positioned within the openings 56 and 86' such that the rivet 28' is capable of rotating within the openings 86' and 56.

The outer surface of the threaded connector 16' of the ferrule 20' has a non-circular shape. Specifically, the threaded connector 16' has a single flat region 101 extending along the axis H and extending about the perimeter of the connector 16'. The threaded connector 16' has a D-shape, as viewed from the bottom of the ferrule in FIG. 13G. Alternatively, the threaded connector 16' of the ferrule 20 may have a double D-shape, a square shape or a rectangular shape, by way of non-limiting example. The hole 18' in the panel 14' that receives the threaded connector 16' of the ferrule 20' also has a complimentary non-circular D-shape. The non-circular shape of the threaded connector 16' prevents rotation of the ferrule 20' with respect to the hole 18' in the panel 14'.

The connector 16' of the ferrule 20' may vary from that which is shown and described. For example, in lieu of the threaded connector 16', the connector may be a barb-style connector, a self-clinching style connector, a flare-in style end or a press-in style end.

Figure 14:
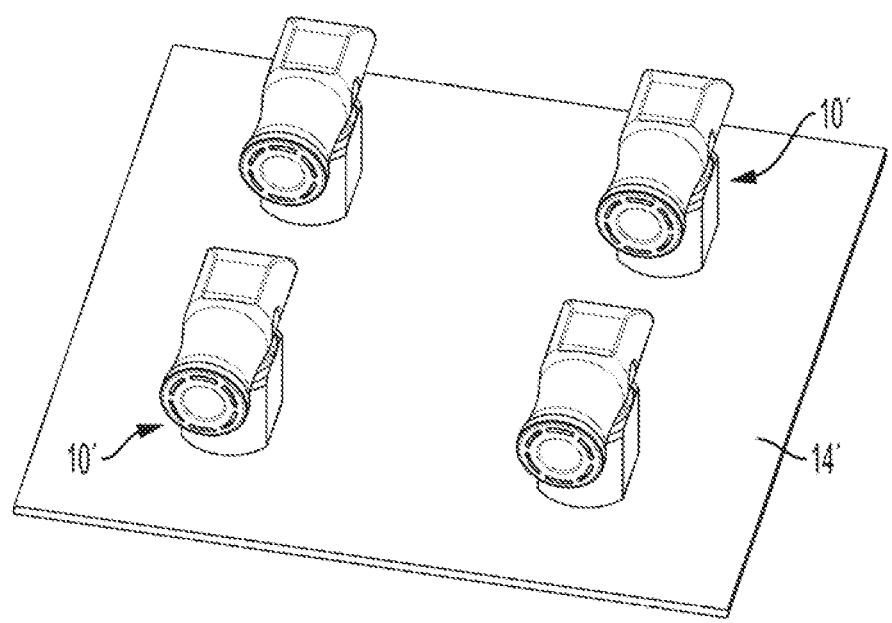
FIG. 14 depicts a plurality (e.g., four) of the latches of FIG. 10 mounted to a panel.

The opening 30' in the ferrule 20' has a non-circular shape. In particular, the opening 30' has two flat regions 103, which together form a double D-shape. The shape of the opening 30' compliments the non-circular exterior shape of the stud 22, such that the stud 22 and the ferrule 20' are non-rotatable with respect to one another. As noted above, the stud 22 is also non-rotatably connected to the washer 24. Thus, in summary, the ferrule 20', washer 24, stud 22' and panel 14 are non-rotatable with respect to one another in an assembled state. And, by virtue of the aforementioned non-circular shapes, multiple latches 10' may easily be installed and oriented in the same direction, such as shown in FIG. 14.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. A latch comprising:
    a ferrule having a body defining a connection end that is configured to be connected to a panel and an opposite end opposite the connection end, the ferrule defining a hollow interior region and a ferrule opening that opens into the hollow interior region;
    a washer positioned adjacent the opposite end of the ferrule, the washer defining a washer opening;
    a stud having an elongated body extending along a stud axis, the stud being positioned to extend through the ferrule opening and keyed to the washer opening such that the stud rotates about the stud axis along with the washer; and
    a lever pivotably connected to the stud about a pivot axis that is orthogonal to the stud axis, the lever being positioned such that the washer is interposed between the lever and the opposite end of the ferrule;
    wherein rotation of the lever about the pivot axis causes translation of the stud along the stud axis with respect to the ferrule between a latched position, in which an end of the stud protrudes beyond the connection end of the ferrule, and an unlatched position, in which the end of the stud is contained within the interior region defined by the ferrule.

2. The latch of claim 1 further comprising a compression spring positioned between the stud and the ferrule for biasing the stud toward the latched position.

3. The latch of claim 1, wherein the lever includes a pointed tip that is positioned to engage with a detent defined on the washer, the pointed tip of the lever and the detent defined on the washer being configured for biasing the lever in the unlatched position.

4. The latch of claim 1, wherein the lever is configured to rotate along with the washer for adjusting a radial position of the lever about the ferrule.

5. The latch of claim 1, wherein the stud is keyed to the lever such that the stud rotates with the lever.

6. The latch of claim 1, wherein the washer is configured to rotate with respect to the ferrule.

7. The latch of claim 1
    wherein the lever includes a pointed tip that is positioned to engage with a detent defined on the latch, the pointed tip of the lever and the detent defined on the latch being configured for retaining the lever in the unlatched position.

8. A latch assembly comprising:
    a panel and
    a latch according to claim 1,
    the connection end of the ferrule of the latch being connected to the panel.

9. A latch comprising:
    a ferrule having a body defining a connection end that is configured to be non-rotatably connected to a panel and an opposite end opposite the connection end, the ferrule defining a hollow interior region and a ferrule opening that opens into the hollow interior region;
    a washer positioned adjacent the opposite end of the ferrule, the washer defining a washer opening;
    a stud having an elongated body extending along a stud axis, the stud being positioned to extend through the ferrule opening and the washer opening, wherein the stud is non-rotatably connected to both the ferrule opening and the washer opening; and
    a lever pivotably connected to the stud about a pivot axis that is orthogonal to the stud axis, the lever being positioned such that the washer is interposed between the lever and the opposite end of the ferrule;
    wherein rotation of the lever about the pivot axis causes translation of the stud along the stud axis with respect to the ferrule between a latched position, in which an end of the stud protrudes beyond the connection end of the ferrule, and an unlatched position, in which the end of the stud is contained within the interior region defined by the ferrule.

10. The latch of claim 9, wherein the washer opening, the connection end of the ferrule, the ferrule opening and the stud are each non-circular.

11. A latch assembly comprising:
    a component; and
    a plurality of the latches of claim 9 indirectly or directly coupled to the component.

12. A latch comprising:
    a ferrule having a body defining a connection end that is configured to be non-rotatably connected to a panel and an opposite end opposite the connection end, the ferrule defining a hollow interior region and a ferrule opening that opens into the hollow interior region;
    a stud having an elongated body extending along a stud axis, the stud being positioned to extend through the ferrule opening; and
    a lever pivotably connected to the stud about a pivot axis that is orthogonal to the stud axis;
    wherein rotation of the lever about the pivot axis causes translation of the stud along the stud axis with respect to the ferrule between a latched position, in which an end of the stud protrudes beyond the connection end of the ferrule, and an unlatched position, in which the end of the stud is contained within the interior region defined by the ferrule, and wherein the stud is keyed to the ferrule to prevent the stud and the lever from rotating about the stud axis.

* * * * *